(12) United States Patent
Gianoulakis

(10) Patent No.: US 6,350,310 B1
(45) Date of Patent: Feb. 26, 2002

(54) CRYSTAL GROWTH AND ANNEALING FOR MINIMIZED RESIDUAL STRESS

(75) Inventor: Steven E. Gianoulakis, Albuquerque, NM (US)

(73) Assignee: Sandia Corporation, Albuquerque, NM (US)

(*) Notice: Subject to any disclaimer, the term of this patent is extended or adjusted under 35 U.S.C. 154(b) by 0 days.

(21) Appl. No.: 09/327,042

(22) Filed: Jun. 7, 1999

(51) Int. Cl.[7] .................. C30B 11/02; C30B 29/12
(52) U.S. Cl. ................. 117/2; 117/81; 117/82; 117/83; 117/84; 117/942
(58) Field of Search .................. 117/942, 81, 82, 117/83, 84, 2

(56) References Cited

U.S. PATENT DOCUMENTS

| | | | | |
|---|---|---|---|---|
| 4,086,555 A | * | 4/1978 | Krikorian et al. | 338/15 |
| 4,110,080 A | * | 8/1978 | Pastor | 117/940 |
| 4,940,603 A | * | 7/1990 | Soltani | 427/66 |
| 4,980,133 A | * | 12/1990 | Koch | 117/940 |
| 5,037,621 A | * | 8/1991 | Kennedy et al. | 117/940 |
| 5,116,456 A | * | 5/1992 | Nestor | 117/942 |

FOREIGN PATENT DOCUMENTS

| | | | |
|---|---|---|---|
| EP | 0 338 411 A2 | 4/1989 | |
| EP | 0 972 863 A1 | 8/1998 | |
| JP | 9-315894 | 2/1997 | |
| JP | 10-231194 | 2/1997 | |
| JP | 10-265300 | 3/1997 | |
| JP | 11-79880 | 9/1997 | |
| JP | 11-87808 | 10/1997 | |
| RU | 1783009 | * 12/1992 | 117/940 |

OTHER PUBLICATIONS

Bloomstein, et al., *Lithography with 157 nm Lasers*, J. Vac. Sci. Technology, B15(6), Nov./Dec., 1997.
Gianoulakis, *Controlling the Thermal Response of CaF2 Crystals During Annealigng to Minimize Residual Stress Brefringence*, 157 nm Workshop, Feb. 15, 1999.

* cited by examiner

Primary Examiner—Robert Kunemund
(74) Attorney, Agent, or Firm—V. Gerald Grafe

(57) ABSTRACT

A method and apparatus for producing crystals that minimizes birefringence even at large crystal sizes, and is suitable for production of $CaF_2$ crystals. The method of the present invention comprises annealing a crystal by maintaining a minimal temperature gradient in the crystal while slowly reducing the bulk temperature of the crystal. An apparatus according to the present invention includes a thermal control system added to a crystal growth and annealing apparatus, wherein the thermal control system allows a temperature gradient during crystal growth but minimizes the temperature gradient during crystal annealing.

4 Claims, 6 Drawing Sheets

CRYSTAL GROWTH AND ANNEALING FOR MINIMIZED RESIDUAL STRESS

This invention was made with Government support under Contract DE-AC04-94AL85000 awarded by the U.S. Department of Energy. The Government has certain rights in the invention.

BACKGROUND OF THE INVENTION

This invention relates to the field of crystal growth and annealing, specifically a method and apparatus for crystal growth and annealing with minimized residual stress and suitable for production of calcium fluoride ($CaF_2$) crystals.

Crystals are used in a wide variety of applications, including as lenses in digital broadcast cameras and as optical elements in lithography such as in semiconductor processing. Semiconductor lithography at 193 nm wavelengths commonly used fused silica optical elements. Unfortunately, fused silica is damaged by high fluence at 193 nm. The next generation of semiconductor lithography is expected to use 157 nm wavelength illumination. Another material will be required since fused silica is quite opaque to 157 nm wavelength illumination.

$CaF_2$ is one of several candidates for optical elements in 193 nm and 157 nm lithography. Current crystal growth and annealing processes lead to high residual stress in large $CaF_2$ crystals, however, limiting the applicability of $CaF_2$ crystals. High residual stresses in a crystal can cause the crystal to exhibit a spatially varying index of refraction. This can lead to wavefront errors, image degradation, and birefringence, all detrimental to the effectiveness of an optical system using $CaF_2$. Contemporary crystal growth and annealing is illustrated by FIG. 1($a,b$). A powder P is placed in a crucible C. During the growth phase, the powder P is heated to a liquid phase (roughly 1500° C. for $CaF_2$, for example). The crucible C is slowly lowered from the heated region R1, with the crystal X growing in the region R2 where the liquid can cool below a critical temperature. The difference between the liquid temperature T1 and crystal temperature T2 leads to a temperature gradient across the crystal/liquid combination.

Once the crystal growth phase is complete, the crystal X is annealed. FIG. 1$b$ shows the arrangement in a conventional annealing process. The crystal X is placed back in the heated region R1, but the temperature is less than that required to liquefy the crystal X. The crystal loses heat through its top, bottom, and sides. The temperature of the crystal is slowly reduced until it reaches a certain value, typically room temperature (annealing a $CaF_2$ crystal conventionally takes approximately 30 days to bring the temperature from 1000° C. to 50° C., at cooling rates of less than 1° C. per hour). The temperature of the crystal is slowly reduced, conventionally still with a vertical temperature gradient as represented by differences between T1 and T2. After the crystal is completely cooled, typically the top and bottom are cut off to produce a blank. The blank can then be ground and polished to produce an optical element such as a lens, tube, or plate. Current $CaF_2$ crystal production methods reliably produce $CaF_2$ crystals of limited size, because the $CaF_2$ crystals produced exhibit unacceptably high birefringence at sizes over about 6 inch diameter. The limited size crystals limit the numerical aperture available with resulting optical elements, limiting the optical elements' utility for high density lithography. Accordingly, there is a need for a method and apparatus for producing crystals that minimizes birefringence even at large crystal sizes, and is suitable for production of $CaF_2$ crystals.

SUMMARY OF THE INVENTION

The present invention provides a method and apparatus for producing crystals that minimizes birefringence even at large crystal sizes, and is suitable for production of $CaF_2$ crystals. The method of the present invention comprises annealing a crystal by maintaining a minimal temperature gradient across the crystal while slowly reducing the bulk temperature of the crystal. An apparatus according to the present invention includes a thermal control system added to a crystal growth and annealing apparatus, wherein the thermal control system allows a temperature gradient during crystal growth but minimizes the temperature gradient during crystal annealing.

Advantages and novel features will become apparent to those skilled in the art upon examination of the following description or may be learned by practice of the invention. The objects and advantages of the invention may be realized and attained by means of the instrumentalities and combinations particularly pointed out in the appended claims.

DESCRIPTION OF THE FIGURES

The accompanying drawings, which are incorporated into and form part of the specification, illustrate embodiments of the invention and, together with the description, serve to explain the principles of the invention.

DETAILED DESCRIPTION OF THE INVENTION

The present invention provides a method and apparatus for crystal growth and annealing that minimizes residual stress and associated birefringence, and is suitable for producing $CaF_2$ crystals.

METHOD

The method of the present invention is similar to conventional crystal production methods. With the present invention, however, the temperature gradient across the crystal is minimized during annealing. The temperature gradient is kept high during growth, but minimized during annealing. Minimizing the temperature gradient during annealing has been found by the inventors to reduce residual stress and associated birefringence.

A crystal can be grown at temperatures around the liquid phase temperature of the crystal material, with a temperature gradient during growth of 100° C. or more over 6 inches. During annealing, the crystal can be cooled from the growth temperature to room temperature, with a temperature gradient of less than about 8° C. per inch throughout the annealing cycle. For $CaF_2$, the growth temperature can be around 1500° C. Annealing can cool the crystal to room temperature with temperature gradients in any direction of less than about 8° C. per inch throughout the cooling process; temperature gradients of less than about 4° C. per inch can produce even lower residual stress and consequent undesirable optical properties. It is especially important to maintain a low temperature gradient during the initial phases of annealing, when the hot crystal has a relatively low yield strength.

Figure 1A:
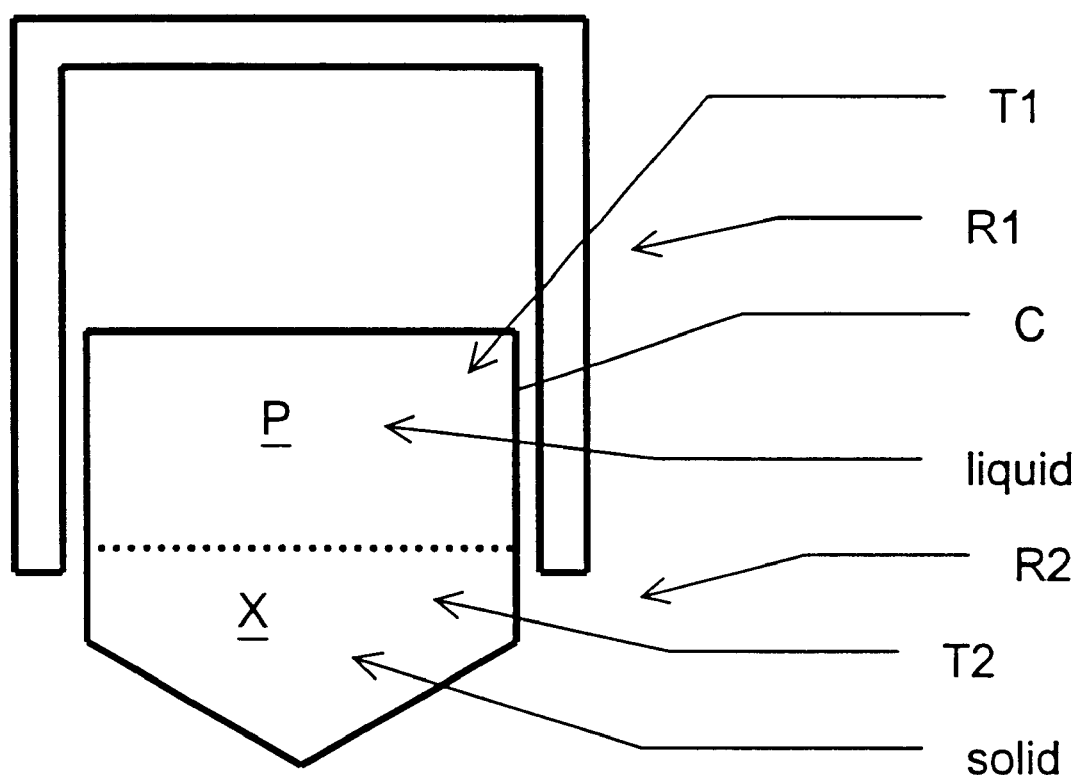
FIGS. 1($a,b$) are diagrams of a conventional crystal growing and annealing apparatus.
Figure 1B:
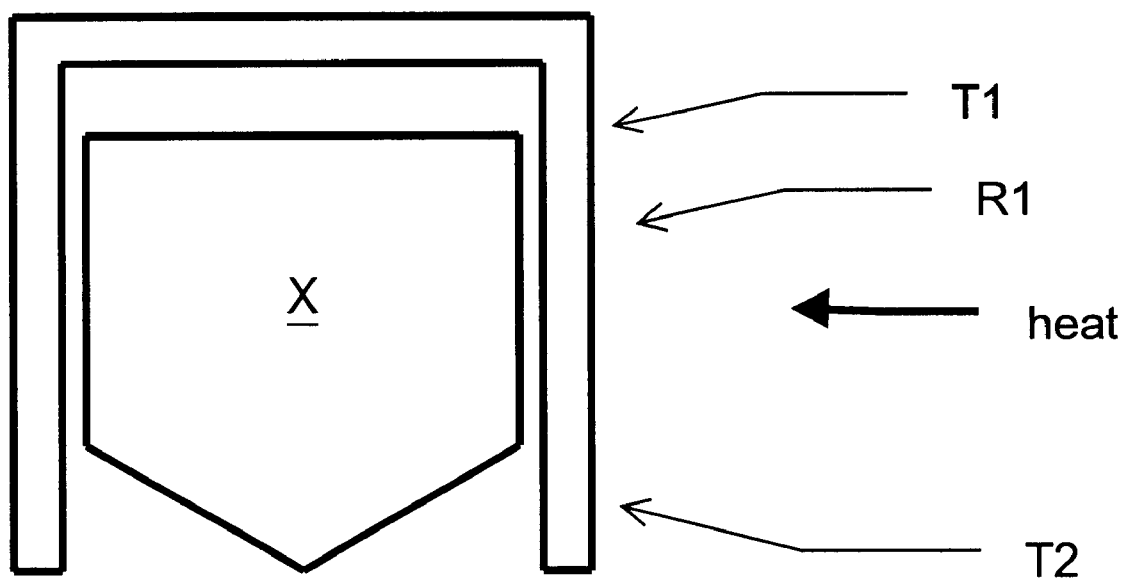
Figure 2:
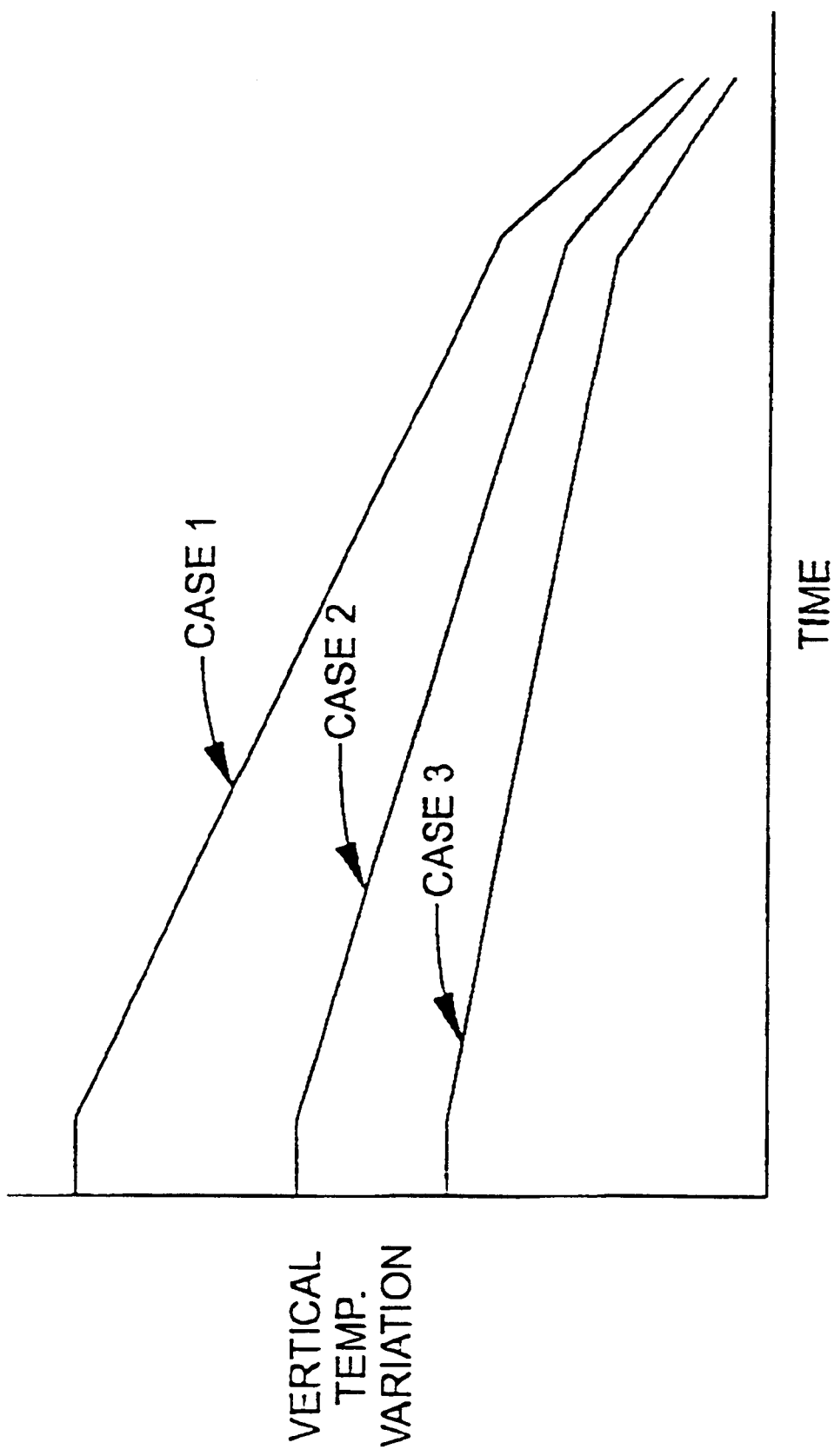
FIG. 2 is a graph of annealing times and vertical temperature gradient.

FIG. 2 is a graph of three different vertical temperature gradients during annealing. In a conventional crystal growth and annealing apparatus the vertical temperature gradient exceeds the temperature gradients in any other direction. The vertical temperature gradient is depicted as a function of annealing time. Case 1 is representative of conventional annealing processes, exhibiting a high initial vertical temperature gradient slowly decaying as the crystal temperature is reduced. Case 2 represents an annealing process according to the present invention, exhibiting a much lower vertical temperature gradient and also decaying as the crystal temperature is reduced. Case 3 represents an annealing process according to the present invention, exhibiting an even lower initial vertical temperature gradient decaying as the crystal temperature is reduced. For $CaF_2$ crystal annealing, the time scale can be roughly 20 to 40 days to cool from about 1000° C. to about 20° C. The maximum vertical temperature gradient can be 100° C. or more over 6 inches for Case 1, about 8° C. per inch or less Case 2, and about 4° C. per inch or less for Case 3. Those skilled in the art will appreciate similar relationships for other crystal materials such as magnesium fluoride ($MgF_2$) and sapphire ($SiO_2$), with variations due to growth temperature, thermal expansion coefficients, and yield strength.

Figure 3:
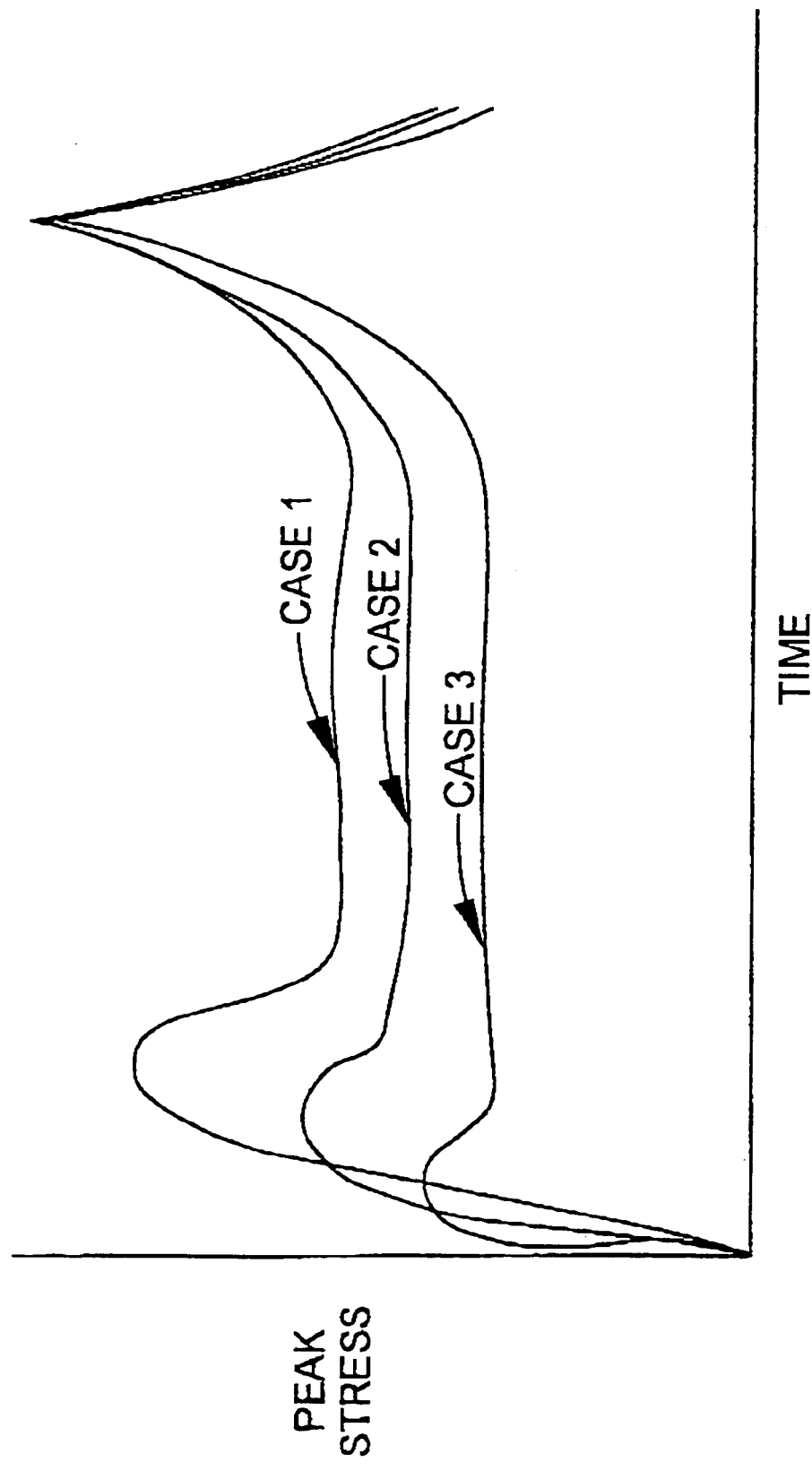
FIG. 3 is a graph of stress response in crystals during annealing processes of FIG. 2.

FIG. 3 is a graph of the von Mises transient peak stress response of a crystal during the annealing times and vertical temperature gradients of FIG. 2. As the crystal cools, thermal expansion and contraction produce internal stresses. If the internal stresses are high, dislocation motion and slippage can occur and produce residual stresses in the cooled crystal. Case 1 (conventional annealing conditions) displays increased peak stress as compared with Case 2 and Case 3, especially in the early stages of annealing. The early stages of annealing correspond with highest crystal material temperature and associated minimal yield strength. Consequently, high stress in the early stages is more likely to exceed the crystal material's yield strength and produce dislocation motion and slippage. Dislocation motion and slippage produce residual stress in the cooled crystal and resulting undesirable optical properties. For $CaF_2$ crystals, the peak stress for Case 1 can be about 7 MPa, for Case 2 about 5.5 MPa, for Case 3 about 4.5 MPa. The annealing time can be about 700 hours.

Figure 4:
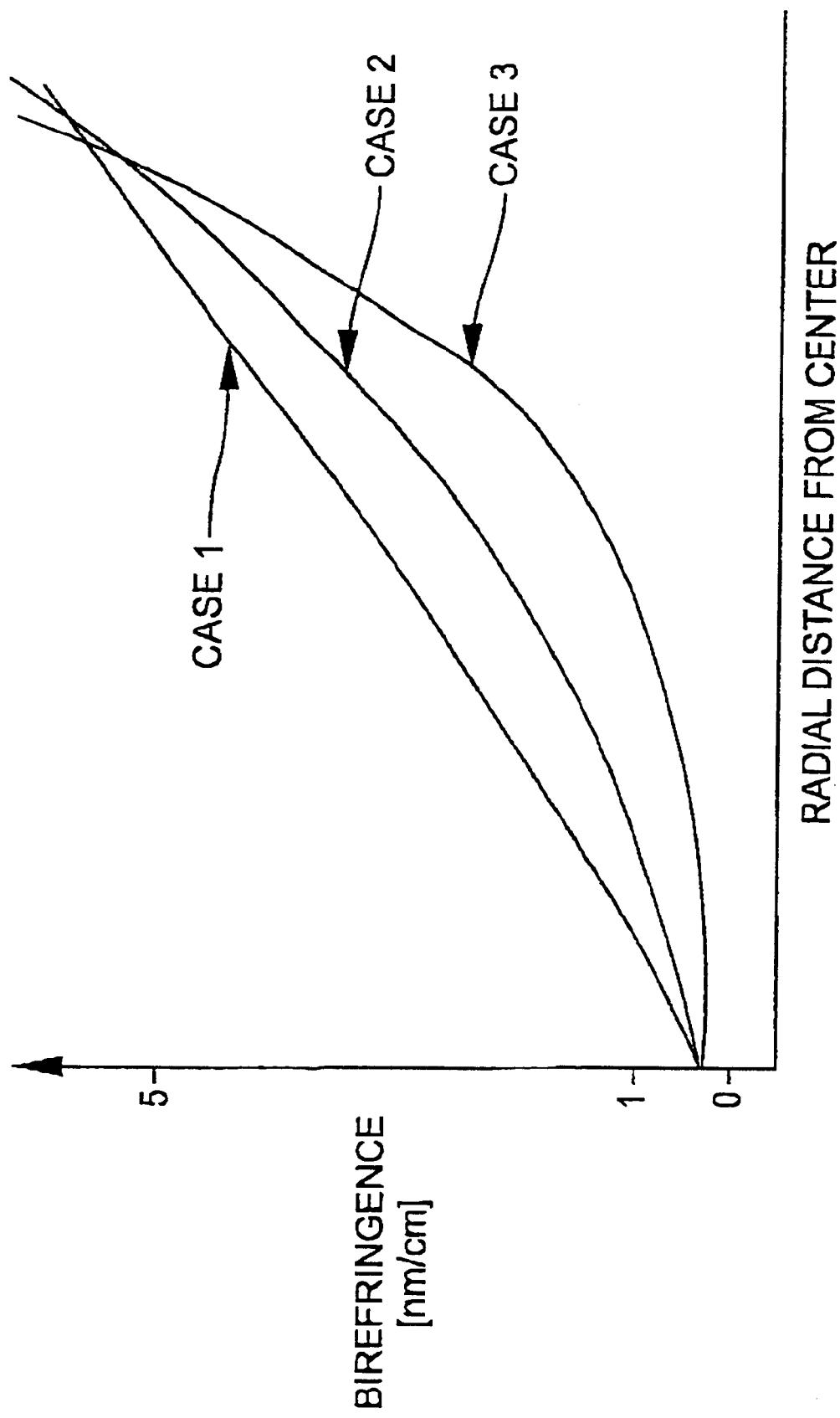
FIG. 4 is a graph of birefringence in crystals annealed under the conditions of FIG. 2.

FIG. 4 is a graph of the birefringence (expressed in nm/cm) of $CaF_2$ crystals annealed with the temperatures, times, and vertical temperature gradients of FIG. 2, graphed as a function of radial distance. Case 1 is the birefringence of a crystal annealed with conventional annealing process conditions. Case 2 and Case 3 exhibit lower birefringence at shorter radial distances compared to Case 1. Case 2 and Case 3 also exhibit birefringence below a critical threshold level at larger radial distances than Case 1, allowing larger diameter optical elements with desirable optical properties to be made from crystals annealed according to the present invention.

APPARATUS

Figure 5:
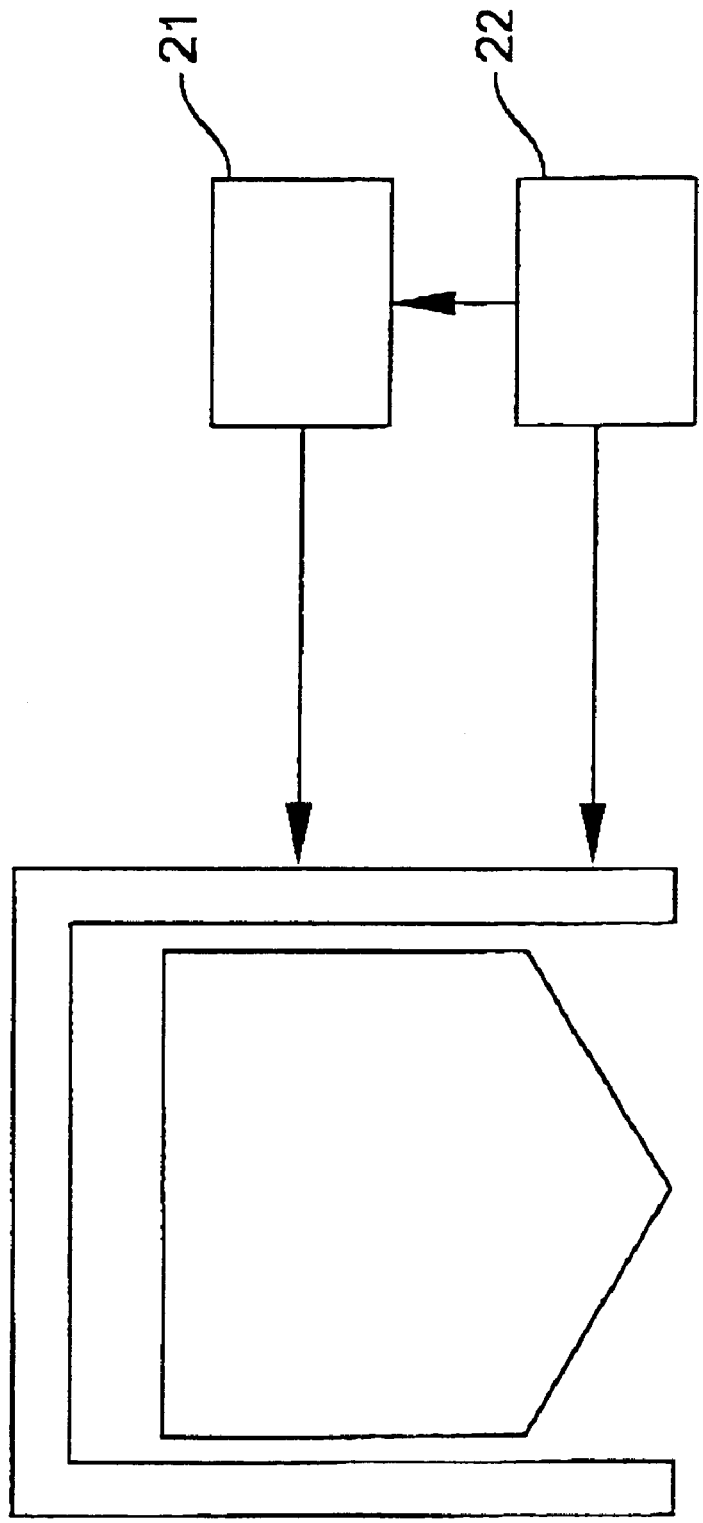
FIG. 5 is a diagram of a crystal growing and annealing apparatus according to the present invention.

An apparatus according to the present invention is shown in FIG. 5. A heat source 21 can maintain the high temperature needed for crystal growth. Once the growth phase is complete, a thermal control system 22 maintains the crystal at a substantially uniform temperature during annealing. Specifically, thermal control system 22 maintains the vertical temperature gradient within limits appropriate for the crystal material, for example less than about 8° C. per inch for $CaF_2$. Temperature gradients of less than about 4° C. per inch can provide even more desirable results for $CaF_2$ crystals. Thermal control system 22 gradually reduces the temperature of the crystal during annealing without allowing a temperature gradient beyond the bounds. Thermal control system can be implemented in various ways that will be apparent to those skilled in the art, including by radiant heating elements appropriately spaced proximal the crystal, insulation, inductive heaters, monitoring and control systems, and combinations thereof.

The particular sizes and equipment discussed above are cited merely to illustrate particular embodiments of the invention. It is contemplated that the use of the invention may involve components having different sizes and characteristics. It is intended that the scope of the invention be defined by the claims appended hereto.

I claim:

1. A method of minimizing birefringence in a $CaF_2$ crystal, comprising annealing the crystal by reducing the overall temperature of the crystal without allowing a temperature gradient of more than about 8° C. per inch.

2. The method of claim 1, wherein the temperature gradient is kept less than about 4° C. per inch.

3. A method of minimizing birefringence when producing a $CaF_2$ crystal, comprising:
   a) Forming a liquid of crystal material by heating the crystal material;
   b) Cooling successive portions of said heated crystal material to temperature suitable for crystal formation;
   c) Cooling the crystal grown in the previous step while maintaining the crystal at a temperature distribution so that no temperature gradient in the crystal is more than about 8° C. per inch.

4. The method of claim 3, wherein the temperature gradient is kept less than about 4° C. per inch.

* * * * *